United States Patent [19]

Zur

[11] Patent Number: 4,893,081
[45] Date of Patent: Jan. 9, 1990

[54] DRIVEN EQUILIBRIUM IN MAGNETIC RESONANCE IMAGING

[75] Inventor: Yuval Zur, Hertzlia, Israel
[73] Assignee: Elscint Ltd., Haifa, Israel
[21] Appl. No.: 330,971
[22] Filed: Mar. 30, 1989

Related U.S. Application Data

[63] Continuation of Ser. No. 78,889, Jul. 29, 1987, abandoned.

[30] Foreign Application Priority Data

Aug. 15, 1986 [IL] Israel ........................................ 79732

[51] Int. Cl.⁴ ............................................. G01R 33/20
[52] U.S. Cl. ...................................................... 324/309
[58] Field of Search ........................................... 324/309

[56] References Cited

U.S. PATENT DOCUMENTS 4,509,015 4/1985 Ordidge .............................. 324/309
4,532,474 7/1985 Edelstein ............................ 324/309
4,654,594 3/1987 Sepponen .......................... 324/309
4,665,365 5/1987 Glover et al. ....................... 324/309

OTHER PUBLICATIONS

Article "Drive Equilibrium RF Pulses in NMR Imaging" by Van Uijen, C. M. J. et al., Magnetic Resonance in Medicine, vol. 1, pp. 502–507, (1984).

Primary Examiner—Michael J. Tokar
Assistant Examiner—Lawrence G. Fess
Attorney, Agent, or Firm—Sandler & Greenblum

[57] ABSTRACT

A Magnetic Resonance (MR) data acquisition system using driven equilibrium in a spin echo scan sequence wherein the dephased spins in the transverse plane are accurately refocused prior to being driven to the Z axis and the encoding gradient pulses are distributed and adjusted to keep the encoding gradient pulses from affecting the refocused magnetization.

19 Claims, 4 Drawing Sheets

DRIVEN EQUILIBRIUM IN MAGNETIC RESONANCE IMAGING

This is a continuation of application Ser. No. 078,889, filed July 29, 1987, now abandoned.

FIELD OF THE INVENTION

This invention is concerned with magnetic resonance imaging (MRI) and more particularly with improvements in the scan sequence known as "driven equilibrium".

BACKGROUND OF THE INVENTION

As in other imaging modalities; but, particularly in MRI, scientists are continually searching for methods and apparatus which can shorten the imaging time. In MRI the imaging time is comparatively long. One method that has been used in the past for decreasing the imaging time is known as the "driven equilibrium" pulse technique.

In driven equilibrium techniques used in conjunction with spin echo imaging sequences, the spins in the XY plane are "driven" back to alignment with the Z axis to shorten the time for the spins to reach equilibrium. For prior art explanations of the driven equilibrium techniques see an article entitled "Driven-Equilibrium Radio Frequency Pulses in NMR Imaging" by C. M. J. van Uijen et al which appeared in the Journal of Magnetic Resonance in Medicine, Volume 1 at pp 502–507 (1984) and U.S. Pat. No. 4,532,474. As noted in the article the driven equilibrium pulse techniques extend the possibility of manipulating image contrasts in pulse sequences with a high repetition rate. The data acquisition time is shortened considerably. What is particularly interesting and important is that the intensity of tissue with large T1's and T2's can be significantly enhanced. This is particularly important in imaging body sections such as cerebral spinal fluid (CSF) sections.

In the early days of NMR imaging, the imaging time was lengthened by the fact that an almost complete return of nuclear magnetizations to equilibrium preceded each excitation. The wait for equilibrium was done to prevent signal loss in imaging techniques with inherent low sensitivity.

In the pulse sequence proposed by C. M. J. Van Uijen et al for spin echo imaging with driven equilibrium, the phase of the spins prior to Z axis restoration is independent of magnetic field inhomogeneities. It is imperative for the success of the sequence, that:

(1) at a given point all the spins in the selected slice are precisely in phase; and (2) the 90 degree Z restoring pulse is delivered along an axis which is exactly perpendicular to the direction along which the transverse magnetization is focused.

There are problems in achieving these criteria. The requirement for precise refocusing are extremely stringent; therefore, even small deviations caused by the eddy currents generated by the gradients are enough to seriously degrade the amount of magnetization restored to the Z axis.

Even when the spins are precisely refocused, the phase of the refocused spin is not predictable. Also due to the eddy currents generated responsive to the phase encoding gradient pulses, the phase of the last echo varies from cycle to cycle. Finally, the dependence of correct image contrast on perfectly rectangular sliced profiles is much stronger than with normal spin echo sequences. This results from the high sensitivity of the Z restoration to the slice profile.

Due to these problems, driven equilibrium techniques have not been generally utilized. Where they are utilized, they have not been reliable. Accordingly, scientists in the field are still endeavoring to find means and methods for using driven equilibrium to decrease the repetition time in spin echo imaging sequences.

BRIEF DESCRIPTION OF THE INVENTION

Accordingly, it is an object of the present invention to provide a method of acquiring magnetic resonance image (MRI) data wherein perturbed spins are driven to equilibrium, said method comprising the steps of:

using a spin echo scan sequence wherein spins aligned along the Z axis of the magnetic resonance system are perturbed 90 degrees by an RF pulse into the XY plane of the magnetic resonance system where they are dephased and then refocused by 180 degree pulses to form echoes;

receiving said echoes during an application of a view gradient pulse;

defining each sequence by a separate encoding gradient pulse;

restoring the spins to the Z axis after the receipt of at least one echo;

the step of restoring including step of:

accurately refocusing the dephased spins;

distributing the encoding gradient pulses, and adjusting the distributed encoding gradient pulses to keep the said encoding gradient pulses from affecting the phase and magnitude of the refocused magnetization.

According to a feature of the present invention, a preliminary scan sequence is run to "optimize" various values. For example the gradient pulse in the frequency encoding direction is optimized until the last echo remains unchanged in amplitude when such gradient pulses are omitted from the calibration sequence. The optimization of the gradient pulse in the frequency encoding direction is accomplished, among other ways, by varying the amplitude or width, i.e. the area of the frequency encoding gradient pulse.

Another feature of the invention comprises "optimizing" the encoding gradient pulses in the phase encoding direction until the last received echo is unchanged in phase and amplitude when such phase encoding gradient pulses are omitted from the optimization sequence.

According to a further feature of the invention a spin echo imaging sequence is applied with the frequency and phase encoding gradients as optimized before, which includes the driven equilibrium portion, that is, a 90 degree pulse is applied to drive the spins from the XY plane into alignment with the Z axis. The phase of the Z restoring 90 degree pulse is varied until a maximum signal is obtained from an object under test. The maximum signal is obtained when the Z restoring 90 degree pulse is exactly perpendicular to the direction along which the transverse magnetization is focused and in a direction such that the magnetization is restored to the positive Z direction. Yet another feature of the invention, comprises utilization of 180 degree RF pulses that have relatively broad excitation widths.

BRIEF DESCRIPTION OF THE DRAWINGS

The above mentioned and other objects and features of the present invention will be better understood when considered in the light of the following description of a broad aspect of the invention made in conjunction with the accompanying drawings; wherein.

GENERAL DESCRIPTION

Figure 1:
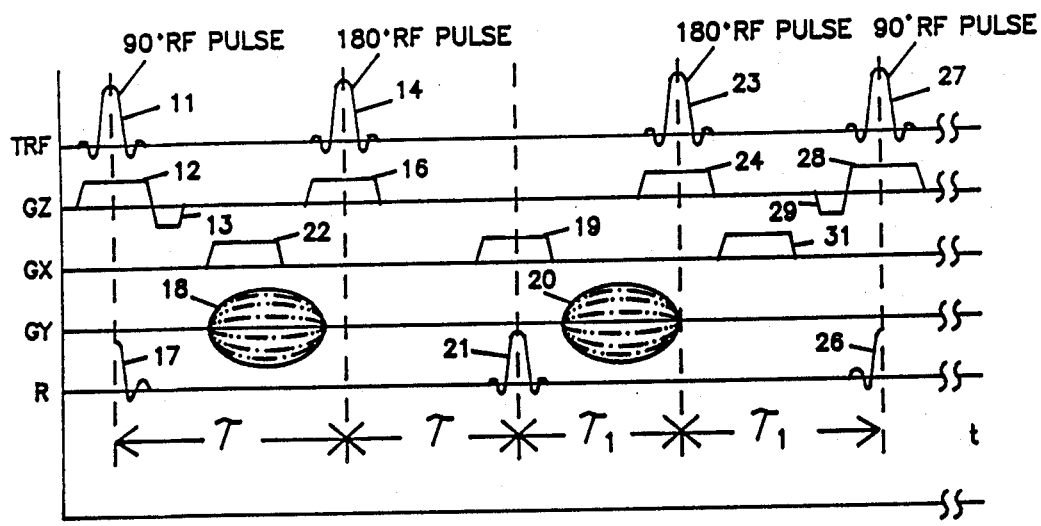
FIG. 1 shows a prior art spin echo pulse sequence using driven equilibrium.

As shown in FIG. 1 the prior art driven equilibrium scan sequence requires a first pulse 11 to tip the spins 90 degrees. The first pulse is applied during the application of a Gz gradient pulse 12 in the direction Z of the large static magnetic field. The Gz gradient pulses are herein sometimes referred to as slice selecting or simply selecting gradient pulses. Immediately subsequent to the application of the pulse 12, a rephasing Gz pulse 13 is applied. After a time period $\tau$ a 180 degree RF pulse 14 is applied during the application of another Gz gradient pulse 16. Note that a free induction decay (FID) signal 17 is obtained when the spins are perturbed into the XY plane. However, it is virtually impossible to receive this signal because it occurs during the application of the 90 degree RF pulse.

In the normal spin echo scan sequence, phase encoding gradient pulses Gy, shown as the envelope of encoding gradient pulses 18, are applied in the direction of the Y axis. One such pulse is applied for each complete repetition of the scan sequence.

Frequency encoding gradient pulses Gx, herein sometimes referred to as viewing gradient pulses are applied in the direction of the X axis. It is during the application of such a pulse 19 that the echo signal 21 is received at time $\tau$ after the application of the 180 degree RF pulse. The echo signal, of course, occurs when the dephased spins in the XY plane are rephased responsive, among other things, to the application of the 180 degree RF pulse. Prior to the application of the Gx gradient pulse 19, a dephasing Gx gradient pulse 22 is applied.

In the driven equilibrium spin echo pulse sequence a second 180 degree RF pulse 23 is applied at a time $\tau 1$ after receipt of the first echo signal 21. This pulse occurs during the application of another Gz gradient pulse 24. At a time $\tau 1$ after application of the second 180 degree RF pulse 23, an echo is again formed shown as signal 26. At that time a 90 degree RF pulse 27 is applied designed to drive the rephased spins back to their original position along the Z axis. A Gz, gradient pulse 28 is applied during the application of the 90 degree RF pulse 27.

The application of the 90 degree RF pulse 27 must occur exactly in synchronism with the echo signal 26. In other words, the 90 degree RF pulse 27 has to be applied when the spins are all in phase in the XY plane. Note that prior to the application of the Gz gradient pulse 28, a dephasing Gz gradient pulse 29 and a rephasing Gx gradient pulse 31 is applied. Also a Gy phase encoding gradient pulse 20 is applied to counteract the last applied Gy encoding pulse of envelope 18.

The amplitude of the Gy gradient pulse 20 is changed every cycle to match the changing amplitudes of the Gy gradient pulse of envelope 18.

The sequence of FIG. 1 is a prior art driven equilibrium sequence. The theory of course is that the 90 degree RF pulse, applied when all of the spins are in phase in the XY plane, drives the spins back to their equilibrium position and thus shortens the time required for the system to return to equilibrium.

As noted hereinbefore, for the driven equilibrium technique to work optimally, it is necessary that all spins are exactly in phase in the X and Y directions. Also the phase of the rephased spins has to be independent of the amplitude of the encoding gradient pulses. However, because of the substantial eddy currents generated by the gradient pulses, it is very difficult to precisely refocus or rephase the spins during the time of the second echo. Also, there is a cycle dependent drift in the phase of the second echo which causes problems in the driven equilibrium sequence of the prior art.

Figure 2A:
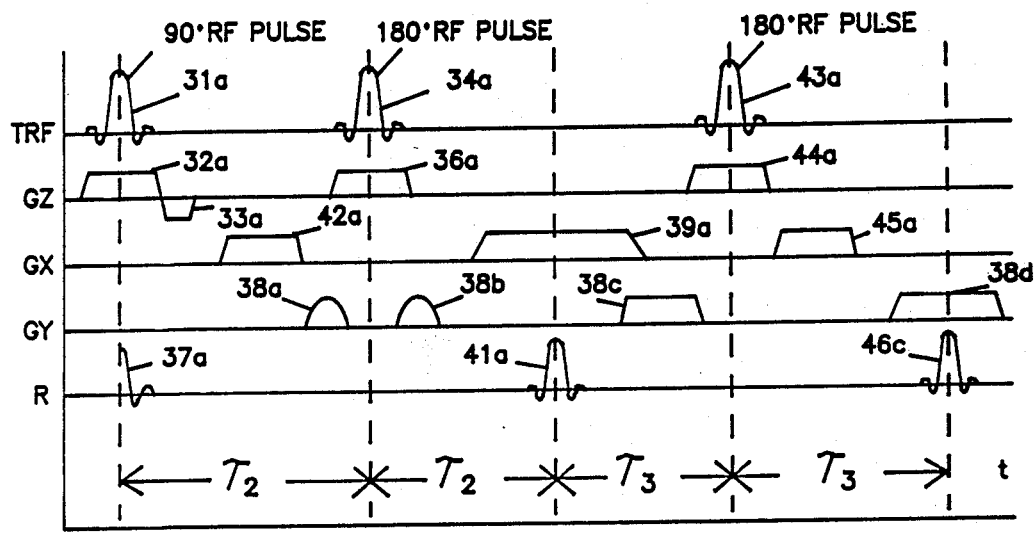
FIGS. 2a, 2b and 2c show optimization sequences for use according to the present invention.
Figure 2B:
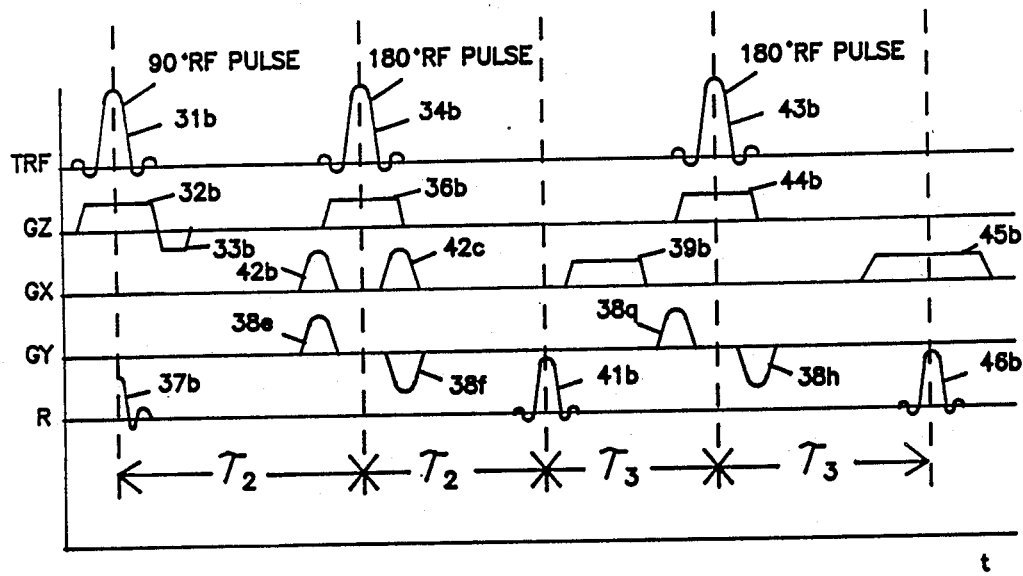
Figure 2C:
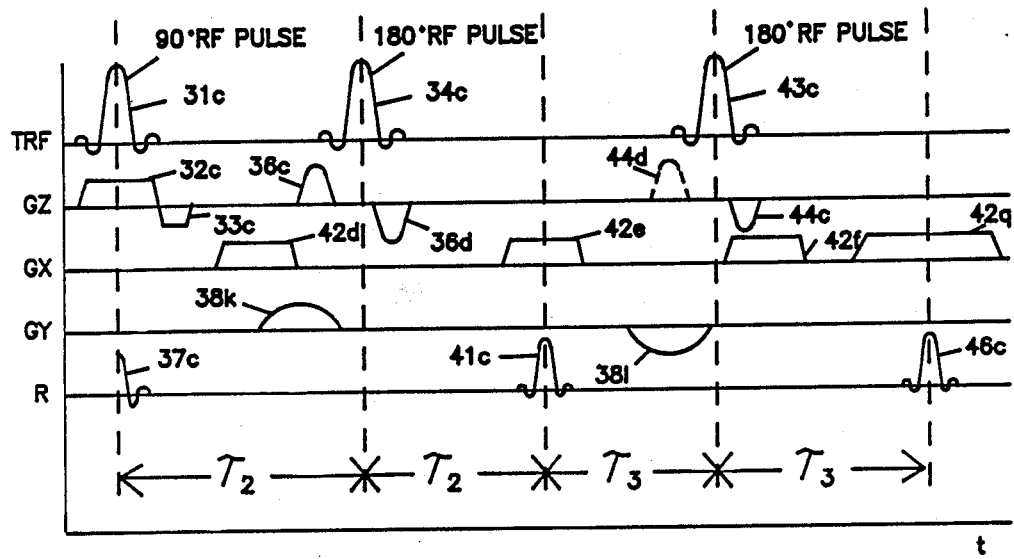

To overcome these problems inventive calibration sequences are applied. The calibration sequences are shown in FIGS. 2a, 2b and 2c. According to the sequence shown in FIG. 2a, the 90 degree RF tipping pulse 31a is applied in the same manner as in the prior art, during the application of a slice selecting Gz gradient pulse 32a. The Gz gradient pulse is shown as being followed by a refocusing Gz gradient pulse 33a. The 180 degree RF pulse 34a is applied at a time $\tau 2$ after the application of the 90 degree RF pulses and during another selecting gradient pulse 36a. Again it should be noted that when the spins are first tilted into the XY plane, an FID signal 37a is received however, because the 90 degree RF tipping pulse 31a is simultaneously being applied it is virtually impossible to receive the signal 37a.

In the calibration optimization sequence shown in FIG. 2a a water phantom is preferably occasionally used within the large static magnetic field. This calibration sequence is not necessary prior to every test but should be done on some periodic basis; such as daily or weekly for example. The calibration optimization sequence is not a data acquisition sequence; therefore, multiple Gy gradients are not required. Only the maximum Gy gradient signals shown at 38a -38d are used for obtaining the echo signals used in the optimization.

At a time $\tau 2$ after the application of pulse 34a, a first echo 41a is received during the application of a Gx gradient pulse 39a. Prior to the application of the 180 degree RF pulse 34a, a dephasing Gx gradient pulse 42a is applied to aid in forming echo signal 41a. The pulse 42a equals the area of the Gx gradient pulse 39a up to the time of the receipt of the echo signal 41a. To minimize the adverse effects of spurious echoes a pair of Gy gradient pulses 38a and 38b are symmetrically applied, on each side of the first 180 degree RF pulse. In addition to aid in the formation of the second echo signal especially in the absence of the Gx gradient pulses, Gy gradient pulses 38c and 38d are applied as shown.

A second 180 degree RF pulse 43a is applied at a time $\tau 3$, after the receipt of the first echo signal 41a and during the application of another Gz gradient pulse 44a. In the calibration sequence there is no second 90 degree RF pulse because at this point the intention is not to drive the system to equilibrium; but rather it is to "optimize" the Gx gradient pulse 45a. At the end of pulse 45a, the spins must be exactly in phase with respect to the X axis. Pulse 45a is preferably applied between the Gy gradient pulses 38c and 38d. During the application of the gradient pulse 38d, and at a time $\tau 3$ after RF pulse 43a a second echo signal 46a is created.

During the real gradient calibration, the pulse sequence is repeated varying the amplitude or width (area) of pulse 45a to maximize the magnitude of echo signal 46a. After the echo signal is maximized the calibration pulse sequence is repeated- without the Gx gradient pulses. When the Gx gradient pulses (i.e. 42a, 39a and 45a) can be omitted without any change in the magnitude of echo signal 46a, then the Gx gradient portion of the system is considered optimized for operating the driven equilibrium sequence.

The second part of the optimization procedure is best shown with the use of FIG. 2b. Herein a 90 degree RF pulse 31b is applied during the application of the Gz selecting gradient pulse 32b followed by a rephasing Gz gradient pulse 33b. The degree RF pulse 34b is applied during the application of a Gz gradient pulse 36b. F.I.D. signal 37b is shown as occurring responsive to the 90 degree pulse 31b.

In the Gy gradient optimization pulse sequence of FIG. 2b, instead of a large dephasing Gx gradient pulse 42a, two small Gx gradient pulses 42b and 42c are applied symmetrically around the 180 degree RF pulse 34b to prevent spurious echoes from combining with the echo 46b. Pulse 34b is applied during Gz gradient pulse 36b.

The Gy gradient pulses 38e and 38e are distributed and sign alternated. Thus instead of having dephasing Gx gradient pulses 42a and one half of 39a along the frequency encoding axis, the phase encoding pulses have positive/negative portions shown as 38e and 38e which are applied prior and subsequent to the application of the pulse 34b.

Echo forming Gx gradient pulses 39b and 45b are applied before and after the second 180 degree RF pulse 43b. The pulse 43b is applied during the application of Gz gradient pulse 44b. Further Gy gradient pulses 38g and 38h are applied on both sides of pulse 43b. The position and amplitude of these pulses is varied to assure that those spins in the transverse plane at the end of pulse 38h are exactly in phase in the Y direction.

The Gx gradient pulse 45b is applied at the time of the receipt of the second echo signal 46b. The optimization is accomplished in this sequence by moving the position and changing the areas of the gradient pulses 38g, 38h. When the echo signal 46b is optimized, the optimization is checked by running the sequence with and without the gradient pulses 38e to 38h. If the echo signal 46b remains unchanged in phase and amplitude when those gradients are omitted from the sequence then, the Gy gradient portion of the system is optimized.

Figure 3:
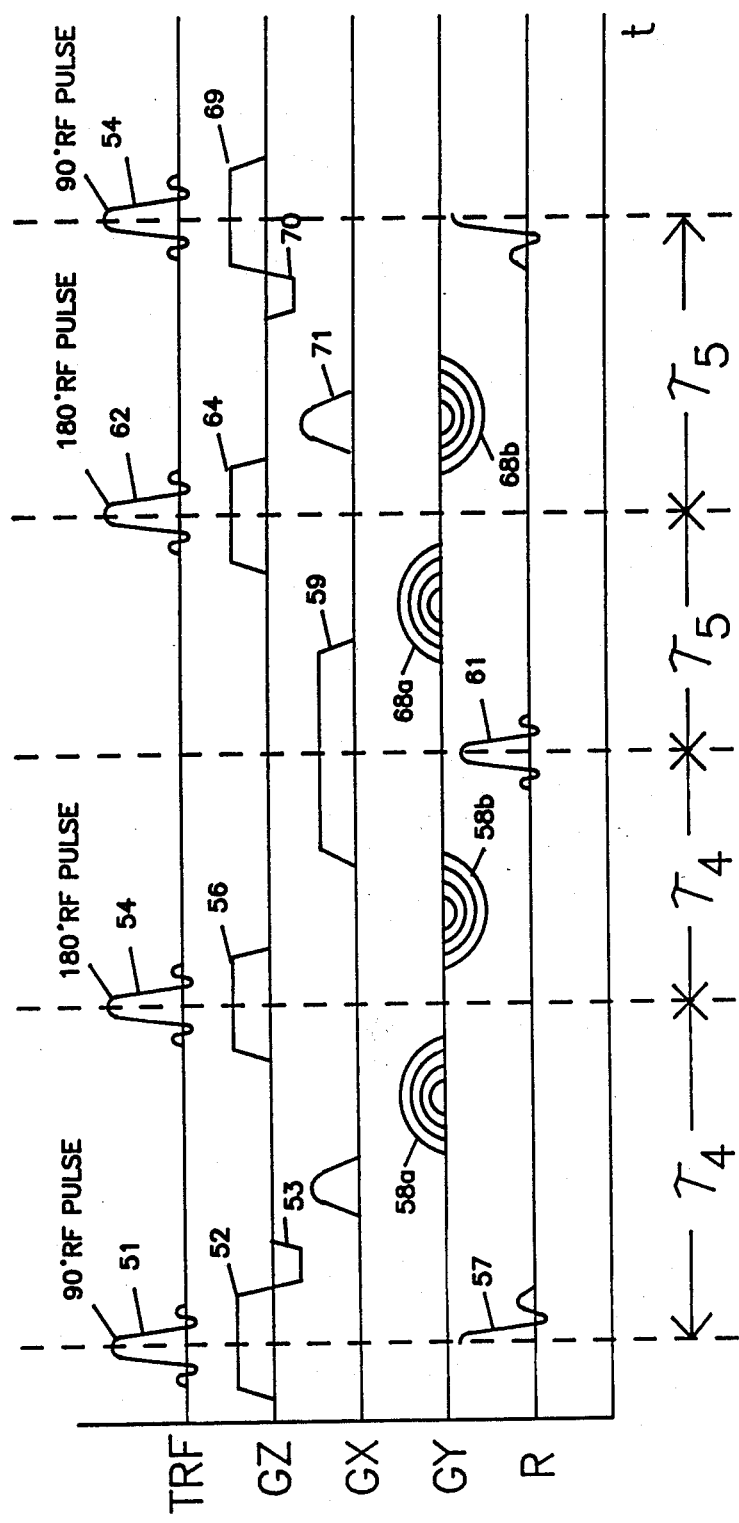
FIG. 3 shows the spin echo driven equilibrium data acquisition sequence of the present invention.

After the calibration or optimization sequences of FIG. 2a and 2b, the full imaging sequence of FIG. 3 is applied with the object under test. A full imaging sequence using the optimized gradient pulses, 45a, 38g, 38h, of FIGS. 2a and 2b is used to optimize the phase of the second 90 degree pulse. More particularly, the phase of the second 90 degree RF pulse is varied until a maximum signal is received from the object under test. For the actual driven equilibrium experimental sequence with a patient, 180 degree RF pulses with relatively broad excitation widths are employed to overcome contrast problem otherwise caused by the extreme sensitivity to non-rectangular pulses. A preferred sequence is shown in FIG. 3. Therein, the first 90 degree RF pulse 51 is applied during the application of Gz gradient pulse 52. The Gz gradient pulse 52 is followed by a rephasing Gz gradient pulse 53. The application of the 90 degree RF pulse 51 generates an F.I.D. pulse 57 when the spins are driven to the XY plane by the application of RF pulse 51.

The first 180 degree RF pulse 54 is applied during the application of a Gz gradient pulse 56. Split and distributed opposite going Gy pulses 58a and 58b are applied around the 180 degree RF pulse 54. The 180 degree RF pulse 54 is applied at a time $\tau 4$ after application of the first 90 degree RF pulse 51. A Gx gradient pulse 59 is applied during the time of the receipt of the first echo signal 61 which occurs at a time $\tau 4$ after the application of pulse 54.

The second 180 degree RF pulse 62 is applied at a time $\tau 5$ after the receipt of the first echo signal and during the application of a Gz gradient pulse 64. Gy pulses 68a and 68b of opposite signs are distributed and placed around the RF pulse 62. A second 90 degree RF pulse 67 for driving the system to equilibrium is applied at the time $\tau 5$ after the application of RF pulse 62 and during the application of a Gz gradient pulse 69. The Gz gradient pulse 69 is preceded by dephasing portion 70 which is opposite in sign to pulse 69. A Gx gradient pulse 71 is applied immediately prior to the application of the 90 degree RF pulse for rephasing the spins in the X direction. Keeping the times $\tau 5$ equal aids in overcoming field inhomogeneities.

The optimization of the Gz gradient is accomplished in accordance with FIG. 2c when three dimensional Fourier transform imaging is utilized. As shown in FIG. 2c the 90 degree Rf pulse 31c is applied during the application of a Gz gradient pulse 32c. An opposite going pulse 33c is also applied as in FIG. 2a. Similarily the non-received signal 37c is also shown. Gx gradient pulses for reinforcing the echo, signals are shown as pulses 42d–42g. The Gy gradient pulses 38k and 38l are both maximum but of opposite signs. No encoding is done. The 180 degree RF pulses 34c and 43c have oppositely going Gz gradient pulses on both sides of each, shown in full lines as pulses 36c and 44c, respectively. The pulses 36c and 44c counteract the spurious echoes, while the position and amplitudes of the pulses 44c are varied to get the spins at the end of pulse 44c exactly in phase in the Z direction and to maximize the echo signal 46c. When the signal 46c is maximized and the Gz gradient pulses can be removed without effecting signal 46c then the Gz gradient is optimized.

Alternatively, two additional Gz gradient pulses 36d and 44d shown in broken line form could be used. In that case pulses 36c and 36d are used to overcome spurious echoes and pulses 44d and 44c are used to optimize the Gz gradients.

Figure 4:
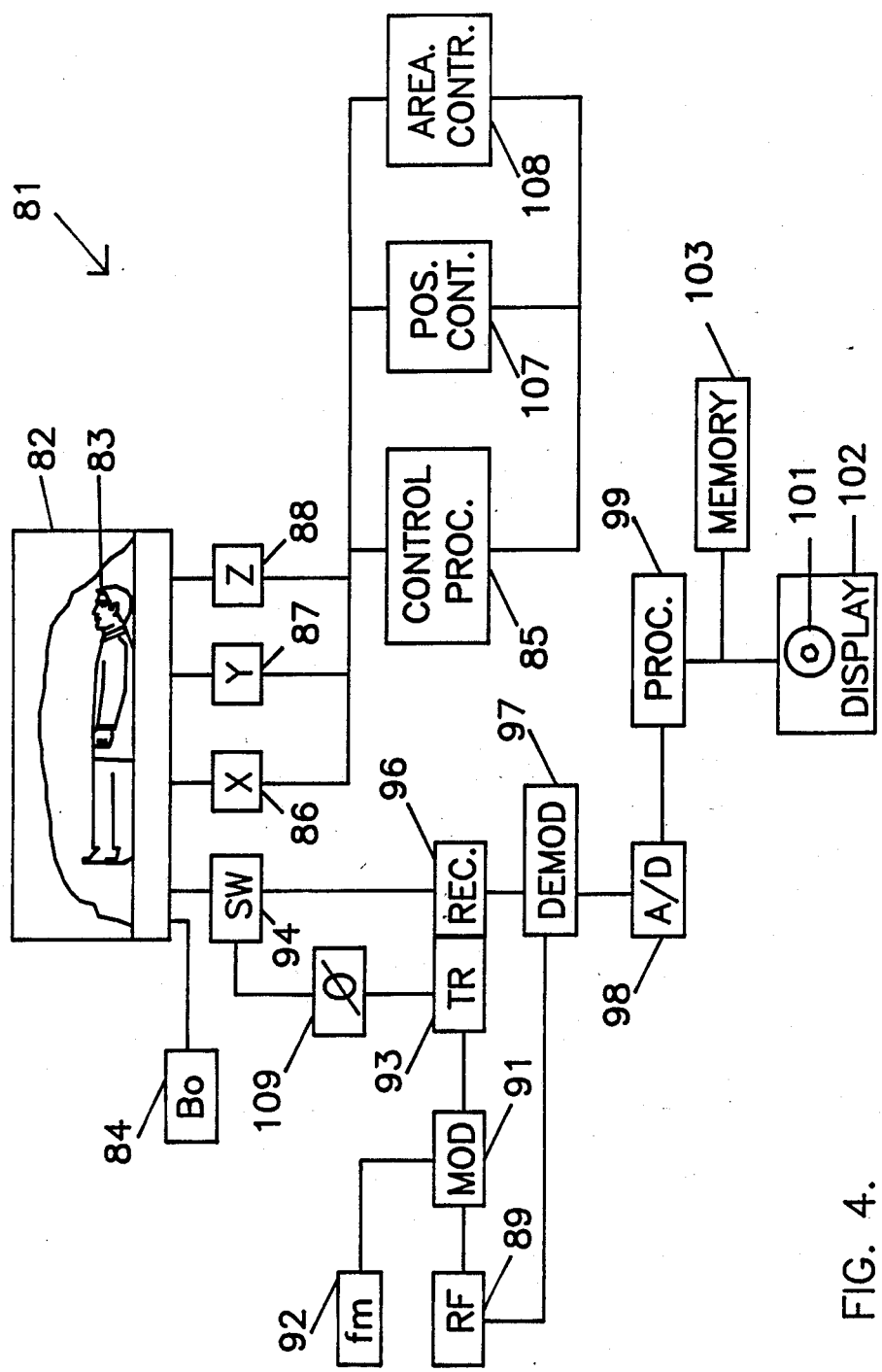
FIG. 4 generally shows in block diagram form, apparatus for performing the sequences of the present invention.

In operation, the system 81 shown in FIG. 4 is used to apply the optimization sequences and the scanning sequence of FIGS. 2 and 3 to obtain the beneficial driven equilibrium results. As shown in FIG. 4, a MRI system is used. Therein a large static magnet 82 is shown for receiving a patient 83 therein. The magnet provides a large static magnetic field generated by the magnetic field generator 84. In a preferred embodiment a superconducting magnet is used, however, it is within the scope of the present invention to utilize any type of magnet.

The system 81 is under the control of the controller 86, which controls the timing and the amplitudes of the pulses used during the sequences. Means are provided for applying X, Y and Z gradients. The means are the Gx, Gy and Gz gradient generators shown as gradient generators 86, 87 and 88, respectively.

Coil means (not shown) are provided for transmitting and receiving radio frequency pulses and signals. The same coil means may be used for transmitting and receiving within the scope of the invention.

The RF pulses transmitted over the coil means are generated using the radio frequency generator 89 which supplies a modulator 91. The modulator also receives a modulation pattern from modulating generator 92. The modulator is used to shape the transmitted radio frequency pulses. The transmitter 93 amplifies and transmits the modulated RF pulse to the transmitting coil.

A switch 94 is used to control the system to either transmit or to receive. The receiver 96 receives the FID or echo signals which are then demodulated by the demodulator 97 which receives the RF frequency from generator 89. The output of the demodulator goes through an analog to digital converter circuit 98. The output of the analog to digital converter circuit 98 is sent to data processor 99 for processing to provide the display image 101 shown on display unit 102. Memory means 103 are provided for use during the processing operation.

The purposes of this invention are carried out by adjusting (optimizing) the gradient pulses. Thus, as shown in FIG. 2a the width and/or amplitude of the X gradient is adjusted by unit 108 until the X gradient can be removed without having any effect on the amplitude of echo 46. Similarly, the position and the area of the Y gradient pulses in FIG. 2b are shown as controlled by units 107 and 108 respectively until the echo 46a is maximized and there is no change in amplitude of the echo when the gradient pulses are removed from the sequence. In practice the gradient pulse variations are controlled by controller 85 itself.

The phase optimization of the 90 degree RF pulse is accomplished by varying the phase of the second 90 degree RF pulse using phase control unit 109 until the received echo is maximized. Here again controller 86 accomplishes the actual phase control.

When multislice scanning is being done then the phase of the second 90 degree pulse is "optimized" for each slice in addition to the other optimization calibrations that are done. More particularly the phase of the second 90 degree pulse for each slice is adjusted using unit 109 until a maximal signal of the object under test is achieved for every slice.

The inventive system as described is also applicable for three dimensional Fourier Transform (3DFT) imaging. The Gz gradient is optimized for three dimensional imaging as described above. In the three dimensional case the Z gradient pulse is also "optimized" by varying the area under the last slice select gradient pulse until the echo signal is optimized and there is no change in the signal when the select gradient pulse is removed.

While the invention has been described with reference to certain preferred embodiments, it should be understood that these descriptions are by way of example only and not as limitations on the scope of the invention, which is defined by the accompanying claims.

What is claimed is:

1. A method of applying a modified spin echo sequence having selecting (Gz), viewing (Gx) and phase encoding (Gy) gradient pulses for acquiring magnetic resonance imaging data wherein echo signals are driven to equilibrium, said method comprising the steps of:
   applying a first 90° RF pulse for tipping spins normally aligned along the Z axis into a transverse plane where the spins dephase,
   applying a first 180° Rf pulse at a time $\tau$ after the application of the first 90° RF pulse to rephase the dephased spins and form a first echo signal at a time $2\tau$ after the application of the first 90° RF pulse,
   applying another 180° RF pulse at a time $n\tau$ after receipt of the first echo signal to again rephase dephasing spins and form another echo signal, where n is any positive odd integer starting with 1,
   applying a second 90° RF pulse during formation of said another echo signal at a time $\tau$ after the application of said another 180° Rf pulse to drive said another echo signal to equilibrium,
   applying said gradient pulses to maximize said another echo signal driven to equilibrium, said step of applying said gradient pulses including the steps of:
   applying a Gz gradient pulse during the application of each of the RF pulses,
   applying a Gx gradient pulse during the receipt of said first echo signal,
   applying a prior Gx gradient pulse prior to the receipt of said first echo signal,
   applying a subsequent Gx gradient pulse after the receipt of said first echo signal and before the receipt of said another echo signal, and
   applying Gy gradient pulses of different amplitudes symmetrically distributed in time about both the first and said another 180° RF pulse, said distributed Gy gradient pulses being positive on one side of each of the 180° RF pulse and negative on the other side of each of said 180° RF pulses.

2. The method of claim 1 and the step of obtaining multislice images comprising maximizing the spins tipped responsive to the application of the second 90° RF pulse for each slice by varying the phase of the second 90° RF pulse for each slice.

3. The method of claim 1 including the process of calibrating said Gx gradient pulses with a phantom prior to using said modified scan sequence to determine the areas under Gx gradient pulses to optimally maximize said another echo signal, said process of calibrating said Gx gradient pulses including the steps of:
   applying a first 90° RF pulse during the application of a first Gz gradient pulse,
   applying a first 180° RF pulse during the application of a second Gz gradient pulse, said first 180° RF pulse being applied at a time $\tau$ after the application of the first 90° RF pulse,
   applying first and second Gy gradient pulses straddling said first 180° RF pulse to diminish spurious echoes,
   applying a first Gx gradient pulse between said first 90° RF pulse and said first 180° RF pulse,
   applying a second Gx gradient pulse during the receipt of a first echo signal which occurs at a time $2\tau$ after the application of the first 90° RF pulse,
   applying a second 180° RF pulse at a time $\tau$ after the receipt of the first echo signal and in the presence of a third Gz gradient pulse to form a second echo signal,
   applying a third Gy gradient pulse between said first and second echo signals,
   applying a fourth Gy gradient pulse extending over the period of said second echo signal,
   applying a third Gx gradient pulse between the application of said second 180° RF pulse and said second echo signal, and
   varying the areas under the Gx gradient pulses to maximize the second echo signal to thereby calibrate said Gx gradient pulses.

4. The method of claim 3 wherein said first Gz pulse includes a rephasing portion.

5. The method of claim 1 including the process of calibrating said Gx gradient pulses with a phantom prior to using said modified scan sequence to determine the locations of and the areas under the Gy gradient pulses to optimally maximize said another echo signal, said process of calibrating said Gy gradient pulses including the steps of:
applying a first 90° RF pulse during the application of a first Gz gradient pulse,
applying a first 180° RF pulse during the application of a second Gz gradient pulse at a time $\tau$ after the application of the first 90° RF pulse to form a first echo signal at a time $2\tau$ after the application of the first 90° RF pulse,
applying first and second Gx gradient pulses straddling said first 180 RF pulse to diminish spurious echoes,
applying first and second Gy gradient pulses straddling said first 180° RF pulses, with one of said first and second Gy gradient pulses being positive and the other being negative,
applying a second 180° RF pulse at a time $\tau$ after formation of the first echo signal to form a second echo signal at a time $2\tau$ after formation of the first echo signal,
applying a third Gx gradient pulse after said formation of said first echo signal,
applying a fourth Gx gradient pulse extending over the period of said second echo signal,
applying third and fourth Gy gradient pulses straddling said second 180° RF pulses, one of said third and fourth Gy pulses being positive and the other being negative, and
varying the locations of and areas under said Gy gradient pulses to maximize the second echo signal and to thereby calibrate said Gy gradient pulse.

6. The method of claim 5 wherein said first Gz pulse includes a rephasing portion.

7. The method of claim 1 wherein said first GZ gradient pulse includes a rephasing portion and said fourth Gz gradient pulse includes a dephasing portion.

8. The method of claim 1 including the step of varying the phase of the second 90° RF pulse to maximize the spins of the second echo signal driven to equilibrium.

9. The method of claim 1 including the process of calibrating said Gz gradient pulse with a phantom to determine the characteristics of the Gz gradient pulses to use in said modified spin echo scan sequence to maximize the echo being driven to equilibrium, said process of calibrating said Gz gradient pulse including the steps of:
applying a first 90° RF pulse during the application of a first Gz gradient pulse, said first Gz gradient pulse having a rephasing portion,
applying a first 180° RF pulse at a time $\tau$ after application of said first 90° RF pulse to form a first echo signal at a time $2\tau$ after application of said first 90° RF pulse,
applying a second 180° RF pulse at a time $\tau$ after the forming of said first echo signal to form a second echo signal,
applying a first positive Gy gradient pulse prior to said first 180° RF pulse and a second negative Gy gradient pulse prior to said second 180° RF pulse,
applying first and second Gx gradient pulse for enhancing said first echo signal and third and fourth Gx gradient pulses for enhancing said second echo signal,
applying a second positive Gz gradient pulse prior to said first 180° RF pulse and a third negative Gz gradient pulse after the application of said second 180° RF pulse, and
varying the locations and areas of the second and third Gz gradient pulses to maximize the second echo signal to thereby calibrate said Gz gradient pulses.

10. The method of claim 9 including the steps of applying a fourth negative Gz gradient pulse after the application of said first 180° RF pulse and a fifth positive Gz gradient pulse prior to said second 180° RF pulse, and
varying the locations and areas under said, third, fourth and/or fifth Gz gradient pulses to maximize the second echo signal to thereby calibrate said Gz gradient pulses.

11. A system enabling using a modified spin echo sequence having selecting (Gz), viewing (Gx) and phase encoding (Gy) gradient pulses, for acquiring magnetic resonance imaging data wherein echo signals are driven to equilibrium, said system comprising:
means for applying a first 90° RF pulse for tipping spins normaly aligned along the Z axis into a transverse plane where the spins dephase,
means for applying a first 180° RF pulse at a time $\tau$ after the application of the first 90° RF pulse to rephase the dephased spins and form a first echo signal at a time $2\tau$ after the application of the first 90° RF pulse,
means for applying another 180° RF pulse at a time $n\tau$ after receipt of the first echo signal to again rephase dephasing spins and form another echo signal where n is any positive odd integer starting with 1,
means for applying a second 90° RF pulse during formation of said another echo signal at a time $\tau$ after the application of said another 180° RF pulse to drive said another echo signal to equilibrium,
means for applying gradient pulses to maximize said another echo signal driven to equilibrium, said means for applying said gradient pulses including:
means for applying a Gz gradient pulse during the application of each of the RF pulses,
means for applying a Gx gradient pulse during the receipt of said first echo signal,
means for applying a prior Gx gradient pulse prior to the receipt of said first echo signal,
means for applying a subsequent Gx gradient pulse after the receipt of said first echo signal and before the receipt of said another echo signal, and
means for applying Gy gradient pulses of different amplitudes symmetrically distributed in time about both the first and said another 180° RF pulses, said distributed GY gradient pulses being positive on one side of each of the 180° RF pulses and negative on the other side of each of said 180° RF pulses.

12. The system of claim 11 including means for calibrating said Gx gradient pulses with a phantom prior to using said modified scan sequence to determine optimal areas under the Gx gradient pulses to maximize said another echo signal, said means for calibrating said Gx gradient pulses including:

means for applying a first 90° RF pulse during the application of a first Gz pulse, means for applying a first 180° RF pulse during the application of a second Gz pulse, said first 180° RF pulse being applied at a time $\tau$ after the application of the first 90° RF pulse, means for applying first and second Gy gradient pulses straddling said first 180° RF pulse to diminish spurious echoes, means for applying a first Gx gradient pulse between said first 90° RF pulse and said first 180° RF pulse, means for applying a second Gx gradient pulse during the receipt of a first echo signal which occurs at a time $2\tau$ after the application of the first 90° RF pulse, means for applying a second 180° RF pulses at a time $\tau$ after the receipt of the first echo signal and in the presence of a third Gz gradient pulse to form a second echo signal, means for applying a third Gy gradient pulse between said first and second echo signals, means for applying a fourth Gy gradient pulse extending over the period of said second echo signal, means for applying a third Gx gradient pulse between the application of said second 180° RF pulse and said second echo signal; and means for varying the areas under the Gx gradient pulses to maximize the second echo signal to thereby calibrate said Gx gradient pulses.

13. The system of claim 1 wherein said first Gz gradient pulse includes as rephasing portion.

14. The system of claim 11 including means for calibrating said Gy gradient pulses with a phantom prior to using said modified scan sequences to determine the locations of and the areas under the Gy gradient pulses to optimally maximize said another echo signal, said means for calibrating said Gy gradient pulses including:

means for applying a first 90° RF pulse during the application of a first Gz gradient pulse, means for applying a first 180° RF pulse during the application of a second Gz gradient pulse at a time $\tau$ after the application of the first 90° RF pulse to form a first echo signal at a time $2\tau$ after the application of said first 90° RF pulse, means for applying first and second Gx gradient pulses straddling said first 180° RF pulse to diminish spurious echoes, means for applying first and second Gy gradient pulses straddling said first 180° RF pulse, with one of said first and second Gy gradient pulses being positive and the other being negative, means for applying a second 180° Rf pulse at a time $\tau$ after formation of the first echo signal to form a second echo signal at a time $2\tau$ after formation of the first echo signal, means for applying a third Gx gradient pulse after said formation of said first echo signal, means for applying a fourth Gx gradient pulse extending over the period of said second echo signal, means for applying third and fourth Gy gradient pulses straddling said second 180° RF pulse, one of said third and fourth Gy pulses being positive and the other being negative, and means for varying the locations and areas under said Gy gradient pulses to maximize the second echo signal and to thereby calibrate said Gy gradient pulse.

15. The system of claim 11 including means for varying the phase of the second 90° RF pulse to maximize the spins of the second echo signal driven to equilibrium.

16. The system of claim 11 and means for obtaining multislice images comprising means for maximizing the spins tipped responsive to the application of the second 90° RF pulse for each slice by varying the phase of the second 90° RF pulse for each slice.

17. The system of claim 11, including means for calibrating said Gz gradient pulse with a phantom to determine location and area characteristics of the Gz gradient pulses to use in said modified spin echo scan sequence to maximize the spins from said another echo being driven to equilibrium, said means for calibrating said Gz gradient pulse including:

means for applying a first 90° RF pulse during the application of a first Gz gradient pulse, said first Gz gradient pulse having a rephasing portion, means for applying a first 180° RF pulse at a time $\tau$ after said first 90° RF pulse to form a first echo signal at a time $2\tau$ after application of said first 90° RF pulse, means for applying a second 180° RF pulse at a time $\tau$ after the forming of said first echo signal to form a second echo signal, means for applying a first positive Gy gradient pulse prior to said first 180° RF pulse and a second negative Gy gradient pulse prior to said second 180° RF pulse, means for applying first and second Gx gradient pulses for enhancing said first echo signal and third and fourth Gx gradient pulses for enhancing said second Gz calibrating echo signal, means for applying a second positive Gz gradient pulse prior to said first 180° RF pulse and a third negative Gz gradient pulse after the application of said second 180° RF pulse, and means for varying the locations and areas of the second and third Gz gradient pulses to maximize the second echo signal to thereby calibrate said Gz gradient pulses.

18. The system of claim 17 including means for applying a fourth negative Gz gradient pulse after the application of said first 180° RF pulse and a fifth positive going Gz gradient pulse prior to said second 180° RF pulse, and means for varying the location of and areas under said second, third, fourth and/or fifth Gz gradient pulses to maximize the second echo signal to thereby calibrate said Gz gradient pulses.

19. The system of claim 14 wherein said first Gz gradient pulse includes a rephasing portion.

* * * * *